(12) United States Patent
Midgley et al.

(10) Patent No.: US 11,026,344 B2
(45) Date of Patent: Jun. 1, 2021

(54) FLUID CONDITIONER FOR COOLING FLUID IN A TANK HOLDING COMPUTERS AND/OR OTHER ELECTRONICS EQUIPMENT, A COOLING SYSTEM INCORPORATING SUCH A FLUID CONDITIONER, AND A METHOD OF COOLING FLUID IN A TANK HOLDING COMPUTERS AND/OR OTHER ELECTRONICS EQUIPMENT

(71) Applicant: DOWNUNDER GEOSOLUTIONS PTY LTD., West Perth (AU)

(72) Inventors: Stuart D. Midgley, West Perth (AU); Mark Lommers, Hamersley (AU)

(73) Assignee: DOWNUNDER GEOSOLUTIONS PTY LTD., West Perth (AU)

( * ) Notice: Subject to any disclaimer, the term of this patent is extended or adjusted under 35 U.S.C. 154(b) by 0 days.

(21) Appl. No.: 15/986,635

(22) Filed: May 22, 2018

(65) Prior Publication Data
US 2018/0279507 A1   Sep. 27, 2018

Related U.S. Application Data

(63) Continuation of application No. PCT/AU2016/051186, filed on Dec. 1, 2016.

(30) Foreign Application Priority Data

Dec. 2, 2015   (AU) ................................ 2015904999

(51) Int. Cl.
*H05K 7/20* (2006.01)
*G06F 1/20* (2006.01)

(52) U.S. Cl.
CPC .......... *H05K 7/20236* (2013.01); *G06F 1/20* (2013.01); *H05K 7/20263* (2013.01);
(Continued)

(58) Field of Classification Search
None
See application file for complete search history.

(56) References Cited

U.S. PATENT DOCUMENTS 4,619,316 A   10/1986   Nakayama et al.
4,704,658 A   11/1987   Yokouchi et al.
(Continued)

FOREIGN PATENT DOCUMENTS

EP   2802197 A1   11/2014
EP   2802197 A1   12/2014
(Continued)

OTHER PUBLICATIONS

International Search Report and Written Opinion, International Application No. PCT/AU2016/051186 dated Feb. 14, 2017.
(Continued)

*Primary Examiner* — Courtney L Smith
(74) *Attorney, Agent, or Firm* — Richard A. Fagin

(57) ABSTRACT

A fluid conditioner 1 for use in a tank 110 containing electronic devices, immersed in fluid F, comprises a housing 10 having a chamber 38, an outlet 14, a heat exchanger 18 located in the chamber, and one or more pumps 16 such that the fluid passes into contact with the heat exchanger. The heat exchanger 18 has an inlet 30 for cooling medium to enter and an outlet 32 for cooling medium to exit. In the upright, operational orientation, the pumps 16 and the heat exchanger 18 are vertically spaced relative to one another and the heat exchanger 18 is located above the outlet. Fluid F is moved through the pumps 16 and passes into contact with the heat exchanger 18. The cooled fluid F exits via the outlet 14 of the fluid conditioner 1 and passes into the lower region of the tank 110 for circulation therethrough.

24 Claims, 4 Drawing Sheets

(52) U.S. Cl.
CPC ..... *H05K 7/20272* (2013.01); *H05K 7/20772* (2013.01); *G06F 2200/201* (2013.01)

(56) References Cited

U.S. PATENT DOCUMENTS

| | | | | |
|---|---|---|---|---|
| 7,485,222 | B2* | 2/2009 | Max | C02F 1/22 210/170.11 |
| 10,020,242 | B2* | 7/2018 | Katsumata | H01L 23/44 |
| 2003/0172669 | A1* | 9/2003 | Tilton | F28D 5/00 62/310 |
| 2007/0227710 | A1* | 10/2007 | Belady | H05K 7/2079 165/122 |
| 2008/0173427 | A1 | 7/2008 | Schumacher | |
| 2009/0301125 | A1* | 12/2009 | Myles | B60H 1/00271 62/323.1 |
| 2011/0132597 | A1 | 6/2011 | Best et al. | |
| 2013/0068423 | A1 | 3/2013 | Campbell et al. | |
| 2015/0334880 | A1* | 11/2015 | Best | H05K 7/20763 361/679.47 |
| 2016/0240226 | A1* | 8/2016 | Shelnutt | G06F 1/206 |
| 2016/0348265 | A1* | 12/2016 | Mayer | C25D 21/18 |

FOREIGN PATENT DOCUMENTS

| | | |
|---|---|---|
| JP | 63-102343 A | 5/1988 |
| JP | 04-170097 A | 6/1992 |
| JP | H04170097 A | 6/1992 |
| JP | H04170097 A | 6/1992 |

OTHER PUBLICATIONS

Australian Examination Report dated Mar. 12, 2019, Australian Application No. 2016363679.
EPO Extended Search Report dated Jul. 23, 2019, European Application No. 16869414.9.
Anderson TM et al: "Liquid Immersion Cooling Scheme for Electronics Installed in an Open, Unsheltered Environment", ip.com Journal, ip.com Inc., West Henrietta, NY, US, Oct. 1, 1996 (Oct. 1, 1996), XP013106124, ISSN: 1533-0001.
Anderson TM et al: "Hermetically Sealed, Field Removable Module Having an Integral Pump and Coolant Heat Exchanger for Forced Convection Immersion Cooling of Electronic Circuit Modules", ip.com Journal, ip.com Inc., West Henrietta, NY, US, Sep. 1, 1992 (Sep. 1, 1992), XP013097956, ISSN: 1533-0001.
Antonetti VW et al: "Thermal System for Immersed Electronics Cooled by Boiling", ip.com Journal, ip.com Inc., West Henrietta, NY, US, Jul. 1, 1971 (Jul. 1, 1971), XP013064070, ISSN: 1533-0001.
Japanese Office Action dated Sep. 11, 2019, Patent Application No. 2018-548245 (translation provided).
Canadian Office Action dated Mar. 4, 2020, for Canadian Patent Application No. 3,006,594.
First Office Action dated Jul. 22, 2020, for Chinese Patent Application No. 201680069927.8.
English translation for the first two pages of First Office Action dated Jul. 22, 2020, for Chinese Patent Application No. 201680069927.8.
Indian First Examination Report dated Dec. 17, 2020, for Indian Patent Application No. 201817019030.

* cited by examiner

FLUID CONDITIONER FOR COOLING FLUID IN A TANK HOLDING COMPUTERS AND/OR OTHER ELECTRONICS EQUIPMENT, A COOLING SYSTEM INCORPORATING SUCH A FLUID CONDITIONER, AND A METHOD OF COOLING FLUID IN A TANK HOLDING COMPUTERS AND/OR OTHER ELECTRONICS EQUIPMENT

CROSS REFERENCE TO RELATED APPLICATIONS

Continuation of International Application No. PCT/AU2016/051186 filed on Dec. 1, 2016. Priority is claimed from Australian Application No. 2015904999 filed on Dec. 2, 2015.

STATEMENT REGARDING FEDERALLY SPONSORED RESEARCH OR DEVELOPMENT

Not Applicable.

NAMES OF THE PARTIES TO A JOINT RESEARCH AGREEMENT

Not Applicable.

BACKGROUND

Throughout the following specification, unless the context requires otherwise, the word "comprise" and variations such as "comprises", "comprising" and "comprised" are to be understood to imply the presence of a stated integer or group of integers but not the exclusion of any other integer or group of integers.

Throughout the following specification, unless the context requires otherwise, the word "include" and variations such as "includes", "including" and "included" are to be understood to imply the presence of a stated integer or group of integers but not the exclusion of any other integer or group of integers.

The present disclosure relates to a fluid conditioner, a cooling system, and a method of cooling fluid. The fluid is contained in a tank that holds computers and/or other electronics equipment, and the fluid conditioner is used to cool the fluid and thereby cool the computers and/or other electronics equipment in the tank.

Any discussion of background art, any reference to a document and any reference to information that is known, which is contained in this specification, is provided only for the purpose of facilitating an understanding of the background art to the present disclosure, and is not an acknowledgement or admission that any of that material forms part of the common general knowledge in Australia or any other country as at the priority date of the application in relation to which this specification has been filed.

The electronic components inside computers and other electronics devices generate heat. The heat generated can be detrimental to the performance and longevity of the computers and other electronics devices. Consequently, various mechanisms and systems exist to cool computers and other electronics devices.

Computers and servers operated in data processing centres are often held in a tank containing a fluid and the computers and servers are immersed in fluid. Typically, the fluid is a dielectric fluid (e.g. mineral oil polyalphaolefins or some other dielectric fluid). The tank, for example, may contain 10 to 20, or more, computers or servers immersed in the dielectric fluid. The data processing centre may contain many such tanks. The heat generated by the computers or servers is transferred to the fluid in the tank. A cooling system is used to extract the heat from the fluid and dissipate it at a location remote from the tank. In this way the temperature of the fluid is maintained at a level at which it can continue to absorb heat generated by the computers or servers, thereby preventing the computers or servers from overheating.

However, existing cooling systems are often bulky. The cooling systems are located outside the tanks that contain the computers or servers and dielectric fluid. In addition, they are prone to leaking the fluid. In the case of leaked dielectric fluid, the leaking results in the surrounding environment being coated with a film of oily, slippery dielectric fluid. This can create an undesirable working environment.

SUMMARY

In accordance with one aspect of the present disclosure, there is provided a fluid conditioner for use in a tank containing computers or other electronic devices immersed in fluid in the tank, the fluid conditioner comprising
    a housing having at least one chamber,
    an outlet,
    a heat exchanger located in the chamber of the housing, the heat exchanger having an inlet for cooling medium to enter the heat exchanger and an outlet for cooling medium to exit the heat exchanger,
    pump means arranged, in use, to pump fluid such that the fluid passes into contact with the heat exchanger in the chamber,
    wherein, in the upright, operational orientation of the fluid conditioner, the pump means and the heat exchanger are vertically spaced relative to one another and the heat exchanger is located above the outlet of the fluid conditioner, and wherein in use, fluid is drawn into and through the pump means to be discharged from the pump means such that fluid passes into contact with the heat exchanger to thereby cool the fluid, and the cooled fluid exits the fluid conditioner via the outlet of the fluid conditioner and passes into the lower region of the tank for circulation through the tank.

In a first embodiment, the pump means is located above the heat exchanger such that, in use, the fluid passes into contact with the heat exchanger to thereby cool the fluid after the fluid passes through the pump means.

In the first embodiment, the outlet of the fluid conditioner comprises an outlet of the chamber.

In a second embodiment, the pump means is located beneath the heat exchanger such that, in use, the fluid passes into contact with the heat exchanger to thereby cool the fluid before the fluid passes through the pump means.

In the second embodiment, the outlet of the fluid conditioner comprises the outlet of the pump means.

The chamber in which the heat exchanger is located separates the fluid that is cooled by the heat exchanger in the chamber, from the warmer fluid in the tank. This may be achieved by the use of substantially solid walls to define the chamber (i.e. the chamber comprises substantially solid walls), apart from (i.e. except for), in the first embodiment, the outlet from which fluid is able to exit the chamber and, in the second embodiment, an inlet through which fluid is able to enter the chamber.

The housing may comprise sheet metal, which forms at least the chamber in which the heat exchanger is located. All or part of the remainder of the housing, i.e. the remainder of the housing above and below the chamber in which the heat exchanger is located, or the remainder of the housing other than the chamber, may be made of or comprises a fluid permeable structure. For example, rigid mesh or a cage-like structure may be used. As a further alternative, a frame-like structure may be used, which may comprise elongate members extending from the corners of the chamber, in which the heat exchanger is located, and joined by cross members. In these alternatives, struts or like members may be provided in the rigid mesh, cage-like structure or frame-like structure to which the pump means may be mounted.

The pump means may be supported by the housing, whether it be sheet metal, rigid mesh, a cage-like structure, a frame-like structure, or of any other suitable form.

It is preferable that the wall of the chamber that separates the heat exchanger from the pump means is slightly permeable to the fluid. Accordingly, this wall of the chamber may be considered to be a baffle. This can be achieved, for example, by providing apertures in the wall. This facilitates submersion of the fluid conditioner into the fluid in the tank and also removal of the fluid conditioner from the fluid in the tank. In the first embodiment, this baffle is located beneath the pump means (i.e. above the heat exchanger) and is also referred to herein as the lower baffle. In the second embodiment, this baffle is located above the pump means (i.e. beneath the heat exchanger).

The baffle may be mounted in the housing and such that it is located between the pump means and the heat exchanger.

In the first embodiment, an upper baffle may be provided above the pump means.

In the second embodiment, a baffle may be provided beneath the pump means.

Preferably, a second chamber is formed between the two baffles, and the pump means is located in the second chamber.

The pump means may be mounted between the two baffles.

Preferably, the fluid conditioner is provided with (i.e. it comprises) an inlet for fluid to enter the housing, and the inlet is located above the pump means.

An inlet chamber may be formed (i.e. provided) in the housing adjacent to the inlet of the fluid conditioner.

Preferably, the fluid conditioner further comprises conduits, in fluid communication with the inlet and the outlet, respectively, of the heat exchanger.

Preferably, filter or strainer means is provided to prevent contaminants entering the pump means and/or the housing.

Preferably, temperature sensor means is provided to sense the temperature of the fluid just prior to the fluid being drawn into the pump means.

In accordance with another aspect of the present disclosure, there is provided a cooling system comprising
at least one fluid conditioner, as herein before described,
a tank to contain the fluid conditioner, the tank also to contain one or more computers or other electronic devices and a fluid in which the fluid conditioner and the one or more computers or other electronic devices are immersed,
a heat exchange unit located exterior of the tank, and
piping or hosing to convey cooling medium between the heat exchanger of the fluid conditioner and the heat exchange unit.

In accordance with another aspect of the present disclosure, there is provided a method of cooling fluid in a tank containing computers or other electronic devices immersed in the fluid comprising (a) pumping fluid, from the upper region of the tank,
(b) moving the fluid downwardly to pass into contact with a heat exchanger to give up heat from the fluid to the heat exchanger and thereby cool the fluid,
(c) flowing the cooled fluid, after having passed into contact with the heat exchanger, from the lower region of the tank, upwardly in the tank and at least around the one or more computers or other electronic devices in the tank, to take up heat from the one or more computers or other electronic devices, and to rise to the upper region of the tank,
(d) repeating steps (a) to (c) in a substantially continuous manner, and
performing steps (a) to (d) without the fluid leaving the tank.

The casings of the computers may have vents or other openings into the interiors of the casings in which components of the computers are held, and flowing the cooled fluid further comprises flowing the cooled fluid into and through the casings of the computers to contact the components of the computers inside the casings.

Other aspects and advantages will be apparent from the description and claims which follow.

BRIEF DESCRIPTION OF THE DRAWINGS

Various example embodiments according to the present disclosure will now be described, by way of example only, with reference to the accompanying drawings, in which.

DETAILED DESCRIPTION

Figure 1:
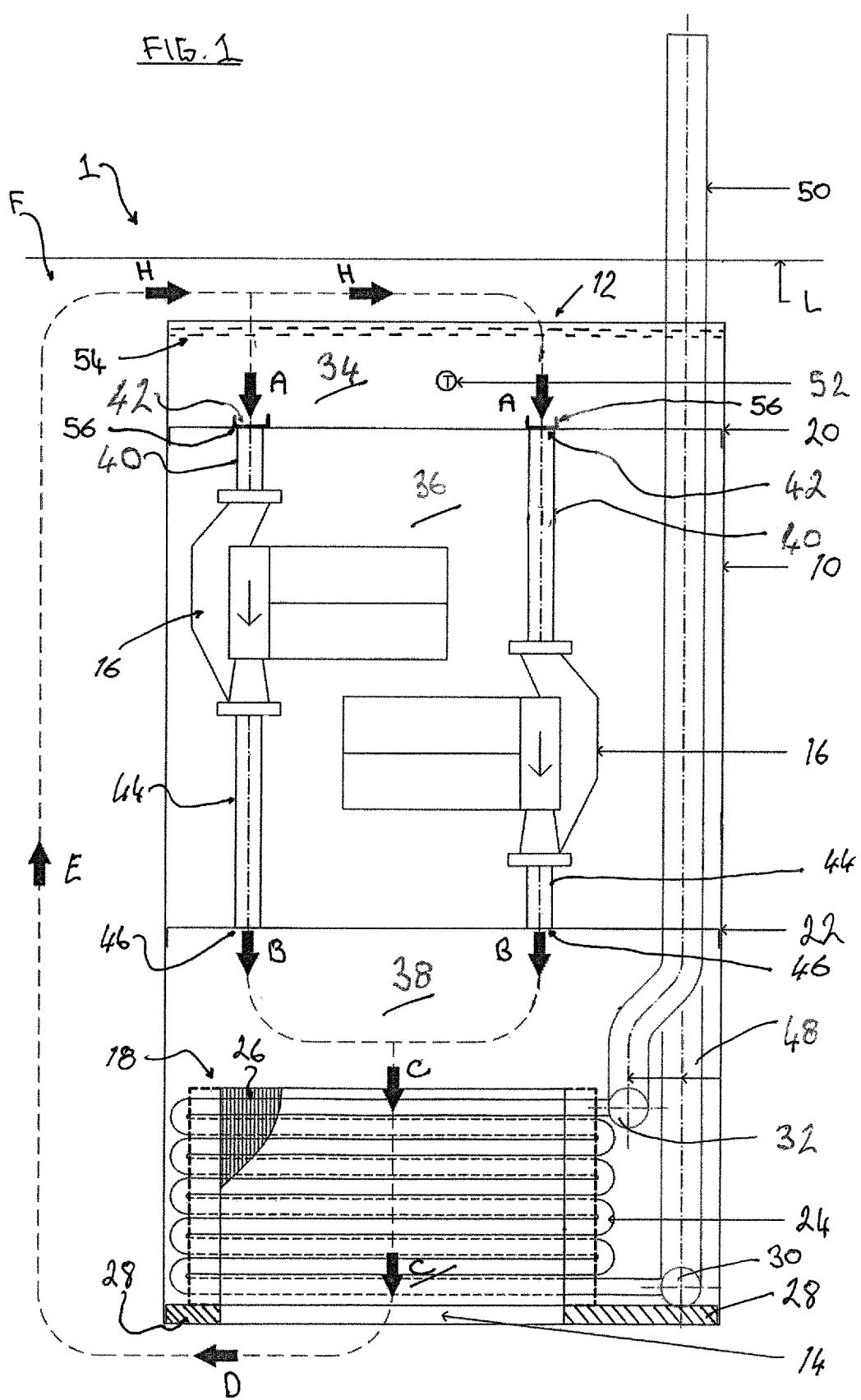
FIG. 1 is a partly schematic view of a first embodiment of a fluid conditioner, in accordance with an aspect of the present disclosure, located in a tank of fluid.

In FIG. 1, there is shown a fluid conditioner 1, in accordance with an aspect of the present disclosure, shown immersed in a fluid F, for example, a dielectric fluid, such as mineral oil, polyalphaolefins or some other dielectric fluid. The level L of the fluid F is such that the fluid conditioner 1 is fully immersed in the fluid F.

Figure 2:
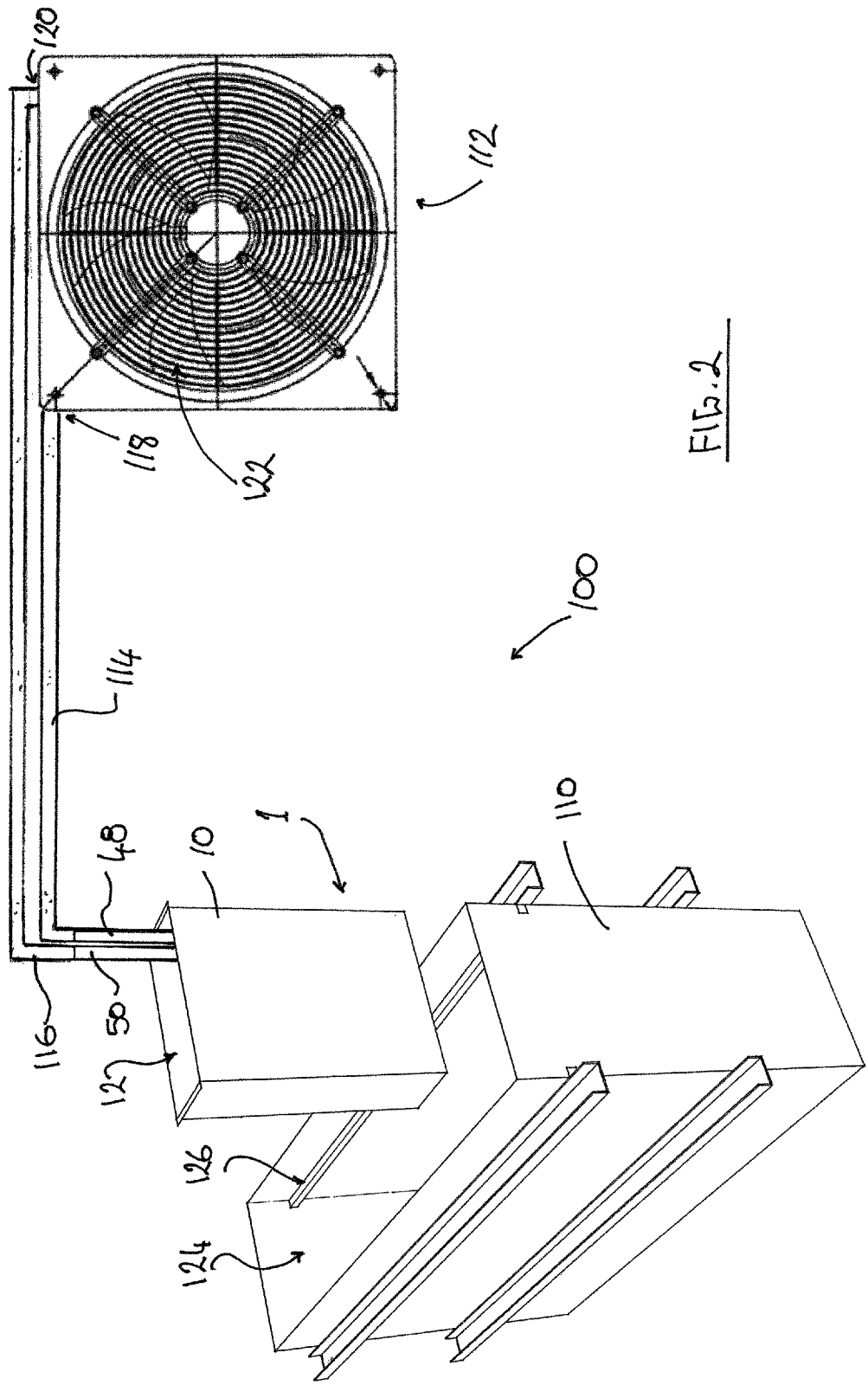
FIG. 2 is a partly schematic view of a cooling system, in accordance with another aspect of the present disclosure, incorporating the fluid conditioner, shown in FIG. 1, positioned outside the tank for clarity of representation.
Figure 3:
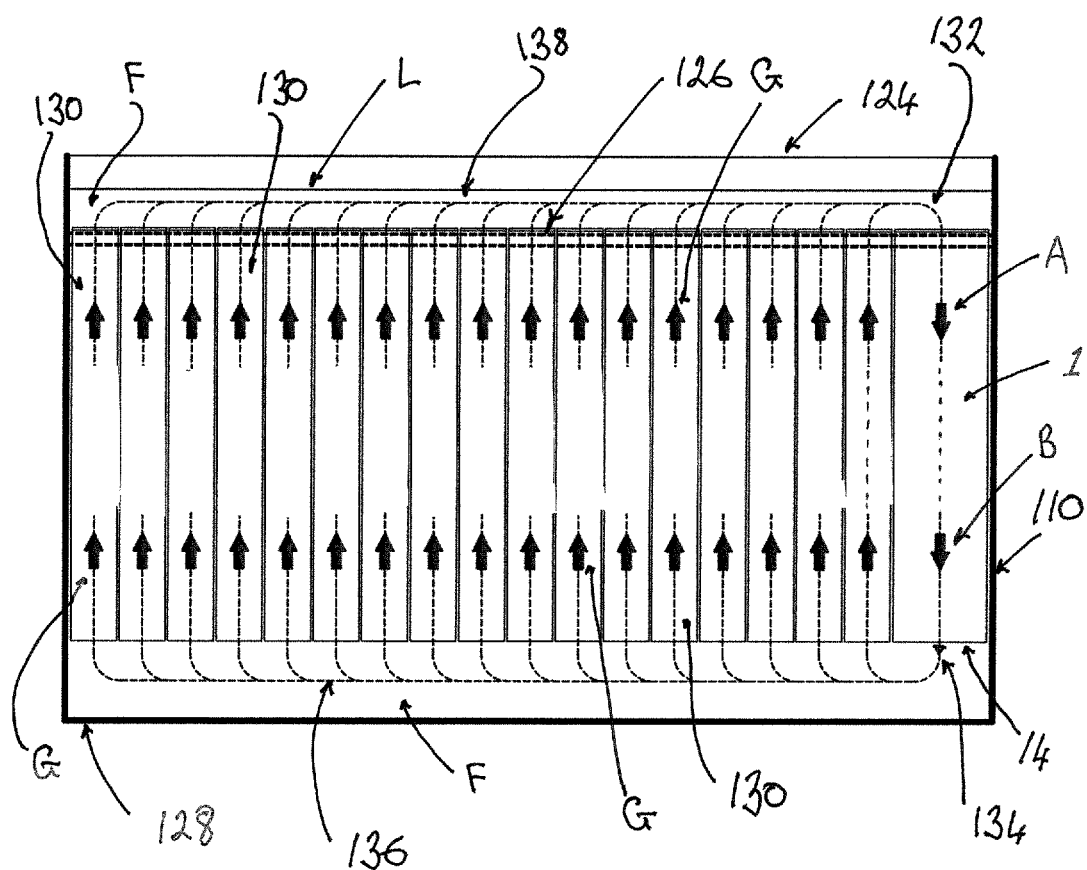
FIG. 3 is an elevation view of the tank of the cooling system, shown in FIG. 2, showing the arrangement of computers and the fluid conditioner, shown in FIG. 1, in the tank.

In use of the fluid conditioner 1, the fluid F is contained in a tank 110, shown in FIGS. 2 and 3, that houses computers 130, or other electronics devices, that have components that generate heat. The computers, or servers, 130 or other electronics devices are immersed in the fluid F in the tank 110 such that the heat generated by the computers 130 is transferred to fluid F. The fluid F thus acts as a cooling bath for the computers 130. However, the heat transferred to the fluid F from the computers 130 must be transferred out of the fluid F. Otherwise, the temperature of the fluid F would rise to a level at which the fluid F no longer provided effective cooling for the computers 130 in the fluid F in the tank 110. The fluid conditioner 1, installed in the tank 110, takes up heat from the fluid F in the tank 110 such that heat in the fluid F is transferred out of the tank 110. This cools the fluid F. The fluid conditioner 1 thereby acts as cooling apparatus for the fluid F and the computers 130 in the fluid F in the tank 110.

The fluid conditioner 1 comprises a housing (or casing) 10, an inlet 12, an outlet 14, and one or more pumps 16 and a heat exchanger 18 that are located in the housing 10. A first baffle, or upper baffle, 20 and a second baffle, or lower baffle, 22 are located in the housing 10.

In the embodiment of the fluid conditioner 1 illustrated in the drawings, the housing 10 is shown as being made from sheet metal. However, as previously herein described, the housing 10 may be made in an alternative manner and alternatives are further described herein.

The pumps 16 may be single phase, standard 110V or 240V, 3A maximum, pumps that run off standard IEC C14 plugs (standard computer plugs).

The heat exchanger 18 comprises a multi-pass coil 24, in a serpentine arrangement, with fins 26 bonded thereto. The multi-pass coil 24 may be fabricated from copper tubing (for example, 13 mm copper tubing) and the fins 26 may be rippled fins made of aluminium (for example, having 0.25 mm thickness).

The inlet 12 may be formed by having the housing 10 completely open at its uppermost part. The outlet 14 is formed by having the housing 10 partly open at its lowermost portion. The open part of the housing 10, which forms the outlet 14, underlies the section of the heat exchanger 18 having the fins 26. The bottom of the housing 10 is closed off by closure plates 28 in the regions beneath which there are no fins 26. This prevents fluid F passing around the outside of heat exchanger 18, i.e. it ensures that fluid F passes through the heat exchanger 18, as will be further described herein.

The heat exchanger 18 is provided with an inlet 30 for cooling medium to enter the heat exchanger 18 and an outlet 32 for cooling medium to exit the heat exchanger 18.

The baffles 20 and 22 are substantially in the form of plates. The first and second baffles 20 and 22 extend between the internal walls of the housing 10 and divide the interior of the housing 10 into three chambers, bounded by the internal walls of the housing 10. The first chamber 34 is in the housing 10 adjacent to the inlet 12 and extends between the inlet 12 of the housing 10 and first baffle 20. The first chamber 34 forms a warm return (dielectric) fluid chamber or fluid inlet chamber. The second chamber 36 extends between the first baffle 20 and the second baffle 22. The second chamber 36 forms an equipment chamber, or pump chamber, and houses the pumps 16. The third chamber 38 extends between the second baffle 22 and the outlet 14 of the housing 10. The third chamber 38 houses the heat exchanger 18 and forms a heat exchanger chamber. The second baffle 22 forms the uppermost wall of the third chamber 38.

The heat exchanger 18 is located in the third chamber 38 such that it is at the lowermost part of the chamber 38 and the housing 10. As best seen in FIG. 1, the bottom of the heat exchanger 18 is just above the outlet 14 at the bottom of the chamber 38 and the housing 10.

The pumps 16 may be mounted to the first and second baffles 20 and 22

The first and second baffles 20 and 22 do not completely seal off the second chamber 36 from the first and third chambers 36 and 38. Instead, the baffles 20 and 22 prevent significant movement of fluid F between the first, second and third chambers 34, 36 and 38, such that fluid F in the second chamber 36 is relatively static. This can be achieved, for example, by providing apertures in the baffles 20 and 22 and/or by providing one or more gaps between edges of the baffles 20 and 22 and the internal walls of the housing 10. This facilitates submersion of the fluid conditioner 1 into the fluid F in the tank 110 and also removal of the fluid conditioner 1 from the fluid F in the tank 110.

The heat exchanger 18 is located in the lowermost part of the housing 10 and the third chamber 38, adjacent to the outlet 14 of the housing 10.

Each pump 16 has a suction line 40 with an inlet 42, and a discharge line 44 with an outlet 46. The inlets 42 open into the first chamber 34, above the first baffle 20, such that the suction lines 40 are in fluid communication with fluid F in the first chamber 34. The outlets 46 open into the third chamber 38, beneath the second baffle 22, such that the discharge lines 44 are in fluid communication with the third chamber 38.

The inlet 30 of the heat exchanger 18 is connected to a first conduit 48 and the outlet of the heat exchanger 18 is connected to a second conduit 50.

The fluid conditioner 1 further comprises a first conduit 48 connected to the inlet 30 of the heat exchanger 18 and a second conduit 50 connected to the outlet 32 the heat exchanger 18.

The fluid conditioner 1 may optionally further comprise a temperature sensor 52. The temperature sensor 52 may be used to monitor the temperature of fluid F in the first chamber 34 near the inlets 42.

The temperature sensor 52 may optionally form part of a control system to control the speed of the pumps 16 or the number of pumps 16 that operate.

However, monitoring of the temperature conditions in the tank 110 may be done by an external proprietary system to check that the fluid F is being adequately cooled and that the cooling arrangement for the tank 110 is functioning correctly. In the event that an abnormal condition is detected (e.g. a power trip occurs, a pump 16 fails, etc.) the temperature of the fluid F will rise and an appropriate course of action can be implemented to address the abnormal condition.

The fluid conditioner 2 may be provided with one or more strainers, or filters, to prevent contaminants (e.g. stickers and labels from the computers, items inadvertently entering the tank 110) entering the pumps 16 and/or the housing 10. For example, a strainer 54 may be provided in the first chamber 34, at or near the inlet 12 to the housing 10. The strainer 54 prevents contaminants entering the housing 10 and consequently prevents contaminants entering the pumps. Alternatively or additionally, a strainer 56 may be provided in the first chamber 34, at the inlet 42 of each pump 16. The strainers 56 prevents contaminants entering the pumps 16. The strainers 54 and 56 may be made of mesh.

The housing 10 may be constructed from mild steel. The housing 10 may be of similar dimensions to standard rack-mounted computers. A housing 10 may typically be 4RU (rack units) in width, 600 mm deep and 19" wide (standard computer rack dimensions).

In use, the fluid conditioner 1 forms part of a cooling system 100, shown in FIG. 2, for cooling fluid F in a tank 110 in which computers 130, or other electronic devices, are immersed together with the fluid conditioner 1, shown in FIG. 3. The cooling system 100 further comprises a heat exchange unit 112 and pipes or hoses 114 and 116 that connect the heat exchanger 18 and the heat exchange unit 112 such that they are in fluid communication. The heat exchange unit 112 is located remotely from the tank 110. In a typical installation, the tank 110 will be housed in a room with other tanks 110 in a building and the heat exchange unit 112 will be located outside the building in ambient conditions.

The pipe or hose 114 is connected to the first conduit 48 of the fluid container 1, at one end, and to the outlet 118 of the heat exchange unit 112 at its other end. The pipe or hose 116 is connected to the second conduit 50 of the fluid conditioner 1, at one end, and to the inlet 120 of the of the heat exchange unit 112 at its other end.

Cooling medium circulates through the heat exchanger 18, the first and second conduits 48 and 50, the pipes or hoses 114 and 116 and the heat exchange unit 112, as will be further described herein, such that the heat exchanger 18 and the heat exchange unit 112 are in fluid communication.

The heat exchange unit 112 may comprise an impeller 122 and an internal pipe and fin arrangement (not visible in FIG. 2). The internal pipe and fin arrangement may be substantially of the same type as that of the heat exchanger 18. In use of the cooling system 100, the cooling medium passes through the internal pipe and fin arrangement, of the heat exchange unit 112, between the inlet 118 and the outlet 120.

The cooling of the fluid F in the tank 110 to the desired temperature can be achieved by an evaporative cooling system, as is shown in FIG. 2 by way of the cooling system 100. Accordingly, the cooling medium may be water or a water solution (e.g. a solution of water with anti-freeze and/or conditioning chemicals) or any other cooling fluid that is non-reactive with components of the cooling system 100 with which the cooling medium comes into contact.

However, in the event that a higher level of cooling of the fluid F is required, a refrigerated cooling system may be used instead of an evaporative cooling system. In the case of a refrigerated cooling system, cooling medium would be a suitable refrigerant and the cooling system would also include a refrigerant compressor.

FIG. 3 shows the fluid conditioner 1 in its operative position in the tank 110. In its operative position in the tank 110, the fluid conditioner 1 is orientated in an upright manner such that the pumps 16 and heat exchanger 18 are vertically spaced relative to each other, one directly above the other. Furthermore, the inlet 12 of the housing 10 is located above the pumps 16, the pumps 16 are located above the heat exchanger 18 and the heat exchanger 18 is located above the outlet 14 of the housing 10. Furthermore, the first chamber 34 is located above the second chamber 36, and the second chamber 36 is located above the third chamber 38. This forms a vertical arrangement of the first, second and third chambers 34, 36 and 38 and the components of the fluid conditioner 1 respectively contained therein.

The fluid conditioner 1 has connections external of the tank 110 to connect the pumps 16 to a power source, such as standard single phase power, and the connections of the first and second conduits 48 and 50 with the pipes or hoses 114 and 116. The fluid conditioner 1 can be easily removed from the tank 110 (e.g. for replacement, servicing, relocation, etc.) by first disconnecting these external connections to the pumps 16 and to the conduits 48 and 50, and then simply lifting the fluid conditioner 1 from the tank 110. Accordingly, the fluid conditioner 1 is a self-contained module.

Since the only external connections are to the pumps 16 and to the conduits 48 and 50, and the connected hardware can be flexible, i.e. flexible power cables to the pumps and flexible hoses 114 and 116 to the conduits 48 and 50, the tank 110 may be mobile, e.g. provided with castors, for easy movement The tank 110 is open at the top, as shown by reference numeral 124 in FIGS. 2 and 3, for insertion of the computers 130 and the fluid conditioner 1, as well as filling the tank 110 with fluid F to the required level L. The fluid conditioner 1 is fully immersed in the fluid F in the tank 110. In addition, the computers 130 are also fully immersed in the fluid F so as to maximise heat transfer from the computers 130 to the fluid F.

The computers 130 and the fluid conditioner 1 are supported in the tank 110 by being suspended from support rails 126 that extend longitudinally along the sides at the upper part of the inside of the tank 110. The computers 130 and the fluid conditioner 1 are positioned upright in the tank 110 and are arranged side by side adjacent one another in the tank 110.

The fluid conditioner 1 is arranged in the tank 110 such that the outlet 14 of the housing 10 is slightly above the bottom 128 of the tank 110. The fluid conditioner 1 is of substantially the same dimensions as the computers 130 in the tank 110.

In use of the fluid conditioner 1 and the cooling system 100, the pumps 16 operate to draw fluid F from the first chamber 34 into the suction lines 40, via the inlets 42, and discharge the fluid F from the outlets 46 of the discharge lines 44 into the third chamber 38.

Due to the suction of fluid F from the first chamber 34 by the pumps 16, a low-pressure region is created above the second chamber (i.e. the pump chamber) 36, namely the low-pressure region is created in the first chamber 34 (which is above the second chamber 36). The discharge of fluid F by the pumps 16 creates a high-pressure region beneath the pumps 16 (and the second chamber 36), namely the high-pressure region is created in the third chamber 38, (which is below the second chamber 36 and in which the heat exchanger 18 is located).

The pressure differential, created by the pumps 16, causes hot fluid F (which stratifies at the upper region of the fluid F in the tank 110, as indicated by reference numeral 132 in FIG. 3,) to flow from the upper region of the tank 110, into the first chamber 34 ("warm return chamber"), via the inlet 12 of the housing 10 and then into the pumps 16 (as shown by arrows A in FIGS. 1 and 3) and through the pumps 16 in the second chamber 36. The pumps 16 discharge the fluid F into the third chamber 38 (as shown by arrows B in FIGS. 1 and 3) so that it passes into contact with the heat exchanger 18 (as shown by arrows C in FIG. 1) and exits the housing 10 via the outlet 14 of the fluid conditioner 1 (which also forms the outlet from the third chamber 38 of the housing 10) into the bottom, or lower region, of the tank 110 (as shown by arrows D in FIG. 1 and reference numeral 134 in FIG. 3). In this way, the pumps 16 operate (or act) to move fluid F downwardly to pass into contact with the heat exchanger 18; that is, fluid F is moved downwardly under operation (or action) of the pumps 16 to pass into contact with the heat exchanger 18. The fluid F is directed to pass into contact with the heat exchanger 18.

As the fluid F passes into contact with the heat exchanger 18, heat (i.e. thermal energy) is transferred from the fluid F to the heat exchanger 18, in particular, to the cooling medium in the multi-pass coil 24. The cooling medium flows through the multi-pass coil 24 and exits the heat exchanger 18 via the outlet 32 and flows in the conduit 50 and the pipe or hose 116 to the heat exchange unit 112 where the heat is given up to the ambient air thereby cooling the cooling medium. The, now cooled, cooling medium flows through the pipe or hose 114 into the conduit 48 and then into the multi-pass coil 24 via the inlet 30 of the heat exchanger 18 to again absorb heat from the fluid F.

The fluid conditioner 1 is positioned in the tank 110 such that the cooled fluid F exits from the outlet 14 at a depth beneath or substantially at the bottoms of the computers 130, represented by reference numeral 134 and best seen in FIG. 3. In FIG. 3, it can be seen that the bottom of the housing 10 (where the outlet 14 is provided) is substantially at the same depth as the bottoms of the computers 130 in the tank 110.

The cooled fluid F that exits the housing 10, via the outlet 14, into the bottom, or lower, region of the tank 110 emerges into the tank 110 at a depth substantially at or beneath the computers 130 (as represented by reference numeral 134) and travels along the bottom of the tank 110, as represented by reference numeral 136 in FIG. 3. The fluid then moves upwardly in the tank 110 at least around the computers 130, i.e. between the computers 130 and between the computers 130 and the inside wall of the tank 110, as represented by arrow E in FIG. 1 and arrows G in FIG. 3. In addition, the casings of computers 130 are often provided with vents or other openings into the interiors of the casings in which the components of the computers 130 are held. In this case, the cooled fluid F also flows into and through the casings of the computers 130, via the vents and other openings, to directly contact the components of the computers 130 inside their casings. These components include components that generate heat (e.g. CPUs, heat sinks, etc.). Fluid F passing into or through the casings of the computers 130 will directly contact the components inside the casings of the computers 130 and consequently heat is transferred from these components to the fluid F.

As the fluid F moves upwardly in the tank 110 (represented by arrow E in FIG. 1 and arrows G in FIG. 3), the fluid F gains heat, via conduction, from the computers 130 (which have components that generate heat), and also from coming into direct contact with components (which generate heat) inside the casings of the computers 130, in the case of the fluid F passing into or through the casings of the computers 130. The heated fluid F rises to the upper region of the tank 110 above the computers 130, as represented by reference numeral 138 in FIG. 3. The heated fluid F stratifies at the upper region of the fluid F in the tank 110, as indicated by reference numeral 132 in FIG. 3, and passes into the first chamber 34, as represented by arrows H in FIG. 1, and is pumped through the fluid conditioner 1, as previously herein described, and this cycle is continuously repeated.

The circulation of the fluid F in the tank 110 is driven by the thermal buoyancy (or buoyant force) generated by the fluid F being heated, as it passes between the computers 130, between the computers 130 and the inside wall of the tank 110, and through the computers 130 (as previously herein described). The circulation of the fluid F in the tank 110 is also driven by the pressure differential generated by the pumps 16 in the fluid conditioner 1.

The baffles 20 and 22 prevent fluid F moving back up in the housing 10 of the fluid conditioner 1 or circulating within the housing 10. The second baffle 22, in particular, ensures that substantially all of the cooled fluid F in the third chamber 38 can exit from the housing 10 only via the outlet 14 of the housing 10 and into the bottom of the tank 110, so that it can then move upwardly in the tank 110 to absorb heat from the computers 130.

Figure 4:
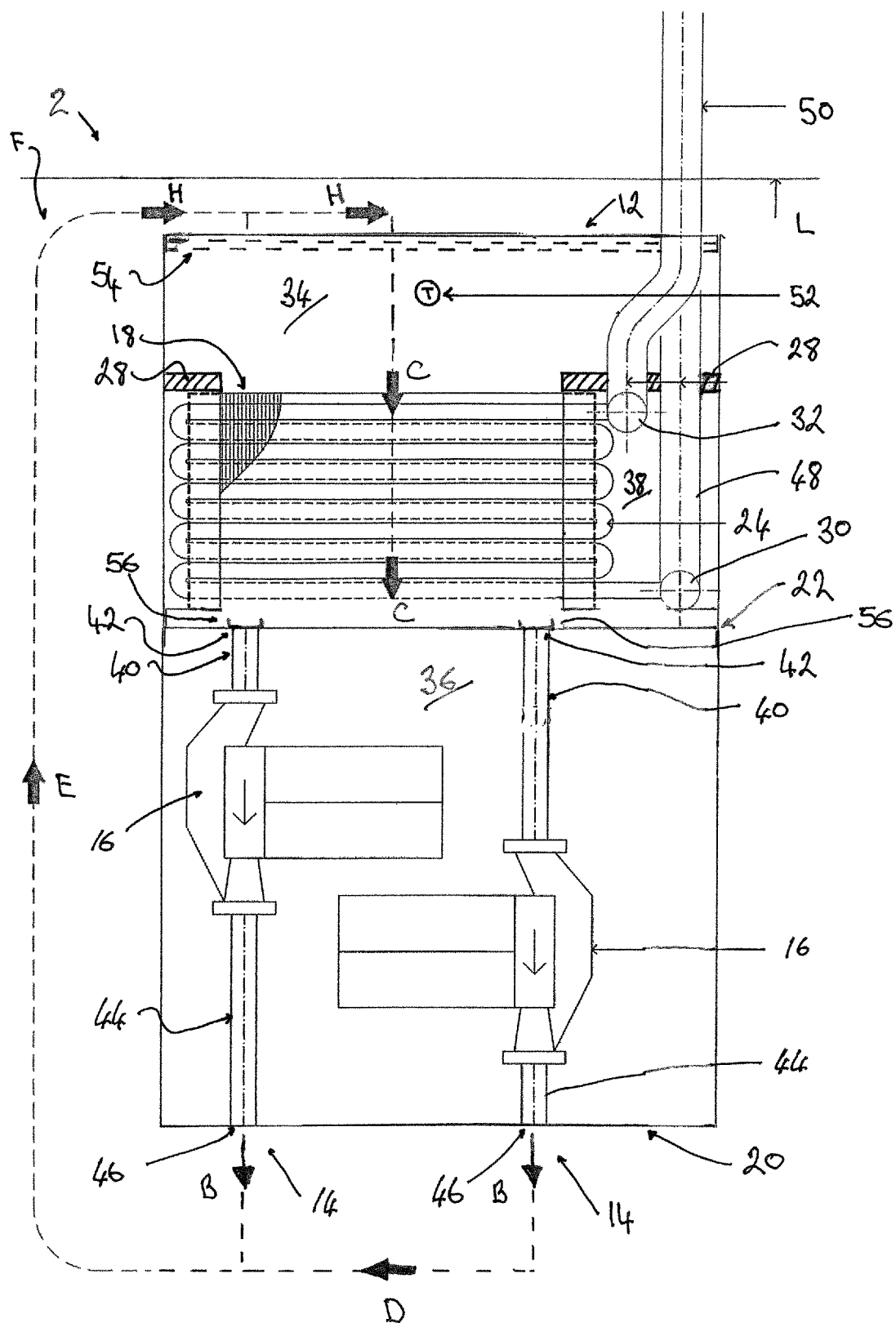
FIG. 4 is a partly schematic view of a second embodiment of a fluid conditioner, in accordance with an aspect of the present disclosure, located in a tank of fluid.

In FIG. 4, there is shown a second embodiment of a fluid conditioner 2, shown immersed in a fluid F, for example, a dielectric fluid, such as mineral oil, polyalphaolefins or some other dielectric fluid. The level L of the fluid F is such that the fluid conditioner 1 is fully immersed in the fluid F.

The fluid conditioner 2 is substantially similar to the fluid conditioner 1 of the first embodiment, except that in the fluid conditioner 2 the chamber 38, in which the heat exchanger 18 is located, is positioned above the pumps 16. In FIGS. 1 and 2, the same reference numerals have been used to denote the same or corresponding parts. The description of the parts and their operation and use of the fluid conditioner 1 apply in an analogous manner to the fluid conditioner 2, and so will not be herein repeated. Accordingly, the following description of the fluid conditioner 2 describes differences between the fluid conditioner 1, of the first embodiment, and the fluid conditioner 2 of the second embodiment.

In the fluid conditioner 2, since the first chamber (i.e. the warm return (dielectric) fluid chamber or fluid inlet chamber) 34 is directly above the heat exchanger chamber 38, the first baffle 20 is not required at the bottom of the first chamber 34, whereas in the fluid conditioner 1 there is a baffle 20 at the bottom of the first chamber 34. Instead, a baffle 20 is provided at the bottom of the pump chamber 36 of the fluid conditioner 2, which also forms the bottom of the housing 10 of the fluid conditioner 2.

Closure plates 28 are provided between the first chamber 34 and the heat exchanger chamber 38. The closure plates 28 are provided in the region above which there are no fins 26 of the heat exchanger 18. This prevents fluid F passing around the outside of heat exchanger 18, i.e. it ensures that fluid F passes from the first chamber 34 through the heat exchanger 18 to contact the fins 26 of the heat exchanger 18.

The second baffle 22 is provided between the heat exchanger chamber 38 and the pump chamber 36 (which is beneath the heat exchanger chamber 38) of the fluid conditioner 2.

The baffles 20 and 22 of the fluid conditioner 2 may be similar to the baffles 20 and 22 of the fluid conditioner 1 such that they do not completely seal off the pump chamber 36 and the heat exchanger chamber 38 from each other and the pump chamber 36 from the fluid F in the tank 110. Instead, the baffles 20 and 22 may prevent significant movement of fluid F between the pump chamber 36 and the heat exchanger chamber 38 (other than through the pumps 16) and between the pump chamber 36 and the fluid F in the tank 110, such that fluid F in the pump chamber 36 is relatively static.

The inlets 42 of the pumps 16 open into the heat exchanger chamber 38, above the second baffle 22, such that the suction lines 40 of the pumps 16 are in fluid communication with fluid F in the heat exchanger chamber 38. The outlets 46 of the pumps 16 open into the fluid F tank 110, beneath the first baffle 20. The outlets 46 form the outlet 14 of the fluid conditioner 2.

In use, the pumps 16 of the fluid conditioner 2 (like the fluid conditioner 1 of the first embodiment) operate to draw fluid F from the first chamber 34 into the suction lines 40, via the inlets 42, and discharge the fluid F from the outlets 46 of the discharge lines 44. However, in the fluid conditioner 2, the pumps 16 operate such that fluid F is drawn, i.e. suctioned, from the first chamber 34, through the heat exchanger chamber 38 into the inlets 42 and then through the pumps 16 to be discharged from the outlets 46 of the pumps 16 into the fluid F in the tank 110.

As the fluid F passes into contact with the heat exchanger 18, heat (i.e. thermal energy) is transferred from the fluid F to the heat exchanger 18, in particular, to the cooling medium in the multi-pass coil 24. This operation, and the operation of the cooling system 100, is the same as herein before described with reference to the fluid conditioner 1 of the first embodiment and FIGS. 1, 2 and 3.

The baffle 22 ensures that substantially all of the cooled fluid F in the heat exchanger chamber 38 can exit from the heat exchanger chamber 38 only via the inlets 42 of the pumps 16 to be pumped out of the outlets 46 of the pumps 16 and into the bottom of the tank 110, so that the fluid F can then move upwardly in the tank 110 to absorb heat from the computers 130.

In the embodiments illustrated in the drawings and described herein, the housing 10 of the fluid conditioners 1 and 2 have substantially solid walls with an open top forming the inlet 12 and in the fluid conditioner 1, an opening at the bottom forming the outlet 14. (The solid walls of the housing 10 may be made of sheet metal.)

However, as also previously described herein in the section entitled Summary, the housing 10 may be provided with substantially solid walls to form only the heat exchanger chamber 38 that contains the heat exchanger 18. All or part of the remainder of the housing 10, i.e. the remainder of the housing 10 above and below the chamber 38 in which the heat exchanger is located, may be made of a fluid permeable structure. For example, rigid mesh or a cage-like structure may be used. As a further alternative, a frame-like structure may be used, which may comprise elongate members extending from the corners of the chamber, in which the heat exchanger is located, and joined by cross members. In these alternatives, struts or like members may be provided in the rigid mesh, cage-like structure or frame-like structure to which the pump means may be mounted. Such variations may be made to both the fluid conditioner 1 of the first embodiment and the fluid conditioner 2 of the second embodiment.

In another alternative embodiment, the housing 10 may be provided with solid walls to form only the pump chamber 36 and the heat exchanger chamber 38 that contain the pumps 16 and the heat exchanger 18, respectively. Such variations may be made to both the fluid conditioner 1 of the first embodiment and the fluid conditioner 2 of the second embodiment.

In a further alternative embodiment, the first chamber 34 may be omitted entirely. In such an embodiment, the first baffle 20, of the fluid conditioner 1, may be either present or omitted. In the case that the first baffle 20 is omitted, the pumps 16 may be supported by being mounted to some other part of the housing 10 instead of the first baffle 20. Similarly, the temperature sensor 52 may be mounted to the housing. Similarly, in an alternative embodiment in which the baffle 20 of the fluid conditioner 2 is omitted, the pumps 16 may be supported by being mounted to some other part of the housing 10 instead of the baffle 20.

The fluid conditioner of the present disclosure may be installed at any suitable location within the tank 110, stacked in line with the computers 130, as shown in FIG. 3. Multiple fluid conditioners may be installed in the tank 110, if required, to provide greater levels of cooling, thus enabling tanks 110 of variable size and capacity to be used.

The fluid conditioner of the present disclosure enables the fluid F to be cooled within the tank 110. That is, no fluid F leaves the tank 110 to cool the fluid F.

The fluid conditioner of the present disclosure may be easily retro-fitted into cooling arrangements that are already in place in existing facilities with a suitable supply of cooling medium.

The cooling system 100 of the present disclosure enables heat to be transferred from the computers 130 to the fluid F, in the tank 110, from the fluid F to the heat exchanger 18, from the heat exchanger 18 to the cooling medium, and from the cooling medium to the heat exchange unit 112 from which it is dissipated to the ambient surroundings.

The fluid F that exits the housing 10, via the outlet 14, into the bottom, or lower region of the tank 110 is at a significantly lower temperature than the fluid F at the upper region of the tank 110 that enters the fluid conditioner.

The cooled fluid F that exits the housing 10, via the outlet 14, into the bottom, or lower region of the tank 110, for example, may have a temperature in the range from 15° C. to 35° C., whilst the warm fluid F at the upper region of the tank 110 may have a temperature in the range from 20° C. to 50° C.

The temperature of the fluid F is largely determined by the heat load of the computers 130 and the temperature and flow rate of the cooling medium circulating in the cooling system 100.

Various embodiments according to the present disclosure may provide several benefits. It avoids bulky equipment; the tank fluid F cooling unit, namely the fluid conditioner, is located in the tank 110—consequently, the tank fluid F does not leave the tank 110 in the cooling process so it cannot leak to the exterior of the tank 110 from the fluid conditioner; maintenance and relocation is readily carried out as it is simply necessary to disconnect the fluid conditioner and remove it from the tank 110 as a complete unit or module.

Whilst one or more preferred embodiments according to the present disclosure have been herein before described, the scope of the present disclosure is not limited to those specific embodiments, and may be embodied in other ways, as will be apparent to a skilled addressee.

Modifications and variations such as would be apparent to a person skilled in the art are deemed to be within the scope of the present disclosure.

What is claimed is:

1. A fluid conditioner for use in a tank containing electronic devices immersed in fluid in the tank, the fluid conditioner comprising:

a housing having at least one chamber and an outlet at bottom of the housing, the housing open at its top;

a heat exchanger located in the chamber of the housing, the heat exchanger having an inlet for cooling medium to enter the heat exchanger and an outlet for cooling medium to exit the heat exchanger;

pump means disposed in the housing and arranged, in use, to pump the fluid such that the fluid passes into contact with the heat exchanger, the outlet of the fluid conditioner comprising an outlet of the pump means; and wherein, in the upright, operational orientation of the fluid conditioner, the pump means and the heat exchanger are vertically spaced relative to one another and the heat exchanger is located above the outlet of the fluid conditioner, wherein the pump means is located above the heat exchanger such that, in use, the fluid passes into contact with the heat exchanger to thereby cool the fluid after the fluid passes through the pump means, wherein the outlet of the fluid conditioner forms an outlet of the chamber, and wherein in use, fluid is drawn into and through the pump means to be discharged from the pump means such that fluid passes into contact with the heat exchanger to thereby cool the fluid, and the cooled fluid exits the fluid conditioner via the outlet of the fluid conditioner and passes into a lower region of the tank for circulation through the tank, and wherein both the fluid conditioner and the electronic devices are immersed in the fluid in the tank, wherein the chamber in which the heat exchanger is located separates the fluid that is cooled by the heat exchanger in the chamber from the warmer fluid in the tank, wherein the chamber comprises solid walls except for the outlet from which fluid is able to exit the chamber.

2. A fluid conditioner according to claim 1, wherein the outlet of the fluid conditioner comprises the outlet of the pump means.

3. A fluid conditioner according to claim 1, wherein the chamber in which the heat exchanger is located separates the fluid that is cooled by the heat exchanger in the chamber from warmer fluid in the tank, wherein the chamber comprises solid walls except for an inlet through which fluid is able to enter the chamber.

4. A fluid conditioner according to claim 3, wherein all or part of the remainder of the housing comprises a fluid permeable structure.

5. A fluid conditioner according to claim 4, wherein the fluid permeable structure comprises rigid mesh or a cage-like structure.

6. A fluid conditioner according to claim 4, wherein the fluid permeable structure comprises a frame-like structure.

7. A fluid conditioner according to claim 1, wherein the wall of the chamber that separates the heat exchanger from the pump means comprises a first baffle and is permeable to the fluid.

8. A fluid conditioner according to claim 7, wherein the first baffle is mounted in the housing and such that it is located between the pump means and the heat exchanger.

9. A fluid conditioner according to claim 7, further comprising a second baffle such that a second chamber is formed between the first baffle and the second baffle, and the pump means is located in the second chamber.

10. A fluid conditioner according to claim 1, wherein the pump means is mounted between a first baffle and a second baffle disposed within the chamber.

11. A fluid conditioner according to claim 1, further comprising an inlet for fluid to enter the housing, and the inlet is located above the pump means.

12. A fluid conditioner according to claim 11, further comprising an inlet chamber in the housing adjacent to the inlet of the fluid conditioner.

13. A fluid conditioner according to claim 1, further comprising conduits, in fluid communication with the inlet and the outlet, respectively, of the heat exchanger.

14. A fluid conditioner according to claim 1, further comprising filter or strainer means to prevent contaminants entering the pump means and/or the housing.

15. A fluid conditioner according to claim 1, further comprising temperature sensor means to sense the temperature of the fluid just prior to the fluid being drawn into the pump means.

16. A cooling system comprising:
at least one fluid conditioner comprising;
a housing having at least one chamber;
an outlet,
a first heat exchanger located in the chamber of the housing, the first heat exchanger having an inlet for cooling medium to enter the heat exchanger and an outlet for cooling medium to exit the heat exchanger,
pump means arranged, in use, to pump fluid such that the fluid passes into contact with the first heat exchanger, and
wherein, in the upright, operational orientation of the fluid conditioner, the pump means and the first heat exchanger are vertically spaced relative to one another and the heat exchanger is located above the outlet of the fluid conditioner, and wherein in use, fluid is drawn into and through the pump means to be discharged from the pump means such that fluid passes into contact with the first heat exchanger to thereby cool the fluid, and the cooled fluid exits the fluid conditioner via the outlet of the fluid conditioner and passes into a lower region of a tank for circulation through the tank;
the tank to contain the fluid conditioner, the tank also to contain one or more electronic devices and the fluid in which the fluid conditioner and the one or more electronic devices are immersed,
a second heat exchange unit located externally to the tank that contains the fluid conditioner and one or more electronic devices, and
piping or hosing to convey cooling medium between the first heat exchanger of the fluid conditioner and the second heat exchange unit.

17. A cooling system according to claim 16, wherein all or part of the housing comprises a fluid permeable structure.

18. A cooling system according to claim 17, wherein the fluid permeable structure comprises rigid mesh or a cage-like structure.

19. A cooling system according to claim 17, wherein the fluid permeable structure comprises a frame-like structure.

20. A cooling system according to claim 16, wherein a wall of the chamber comprises a first baffle and is permeable to the fluid.

21. A cooling system according to claim 20, wherein the first baffle is mounted in the housing and such that it is located between the pump means and the first heat exchanger.

22. A cooling system according to claim 20, further comprising a second baffle such that a second chamber is formed between the first baffle and the second baffle, and the pump means is located in the second chamber.

23. A cooling system according to claim 16, wherein the pump means is mounted between a first baffle and a second baffle disposed within the chamber.

24. A fluid conditioner according to claim 16, further comprising temperature sensor means to sense the temperature of the fluid just prior to the fluid being drawn into the pump means.

* * * * *